(12) United States Patent
Shim

(10) Patent No.: US 9,330,771 B2
(45) Date of Patent: May 3, 2016

(54) SEMICONDUCTOR DEVICE

(71) Applicant: SK hynix Inc., Gyeonggi-do (KR)

(72) Inventor: Jung Woon Shim, Incheon (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/619,953

(22) Filed: Feb. 11, 2015

(65) Prior Publication Data

US 2016/0099063 A1 Apr. 7, 2016

(30) Foreign Application Priority Data

Oct. 1, 2014 (KR) .................. 10-2014-0132630

(51) Int. Cl.
*G11C 16/04* (2006.01)
*G11C 16/14* (2006.01)
*G11C 16/34* (2006.01)

(52) U.S. Cl.
CPC ............ *G11C 16/14* (2013.01); *G11C 16/0483* (2013.01); *G11C 16/3445* (2013.01)

(58) Field of Classification Search
CPC . G11C 16/14; G11C 16/0483; G11C 16/3445
USPC .............. 365/185.17, 185.11, 185.28, 185.29
See application file for complete search history.

(56) References Cited

U.S. PATENT DOCUMENTS

2008/0013378 A1* 1/2008 Crippa ............... G11C 11/5628
365/185.17
2009/0122617 A1* 5/2009 Noh ................... G11C 16/3404
365/185.24

FOREIGN PATENT DOCUMENTS

KR 1020110092523 8/2011

* cited by examiner

*Primary Examiner* — Vu Le
(74) *Attorney, Agent, or Firm* — IP & T Group LLP

(57) ABSTRACT

A semiconductor device includes memory strings each including a drain select transistor, memory cells and a source select transistor, which are connected between a bit line and a common source line and suitable for operating based on voltages applied to a drain select line, word lines and a source select line, respectively, and an operation circuit suitable for performing a pre-program operation, an erase operation and a post-program operation on the memory strings. The operation circuit sequentially performs erase operations on the drain select transistors included in the memory strings.

20 Claims, 10 Drawing Sheets

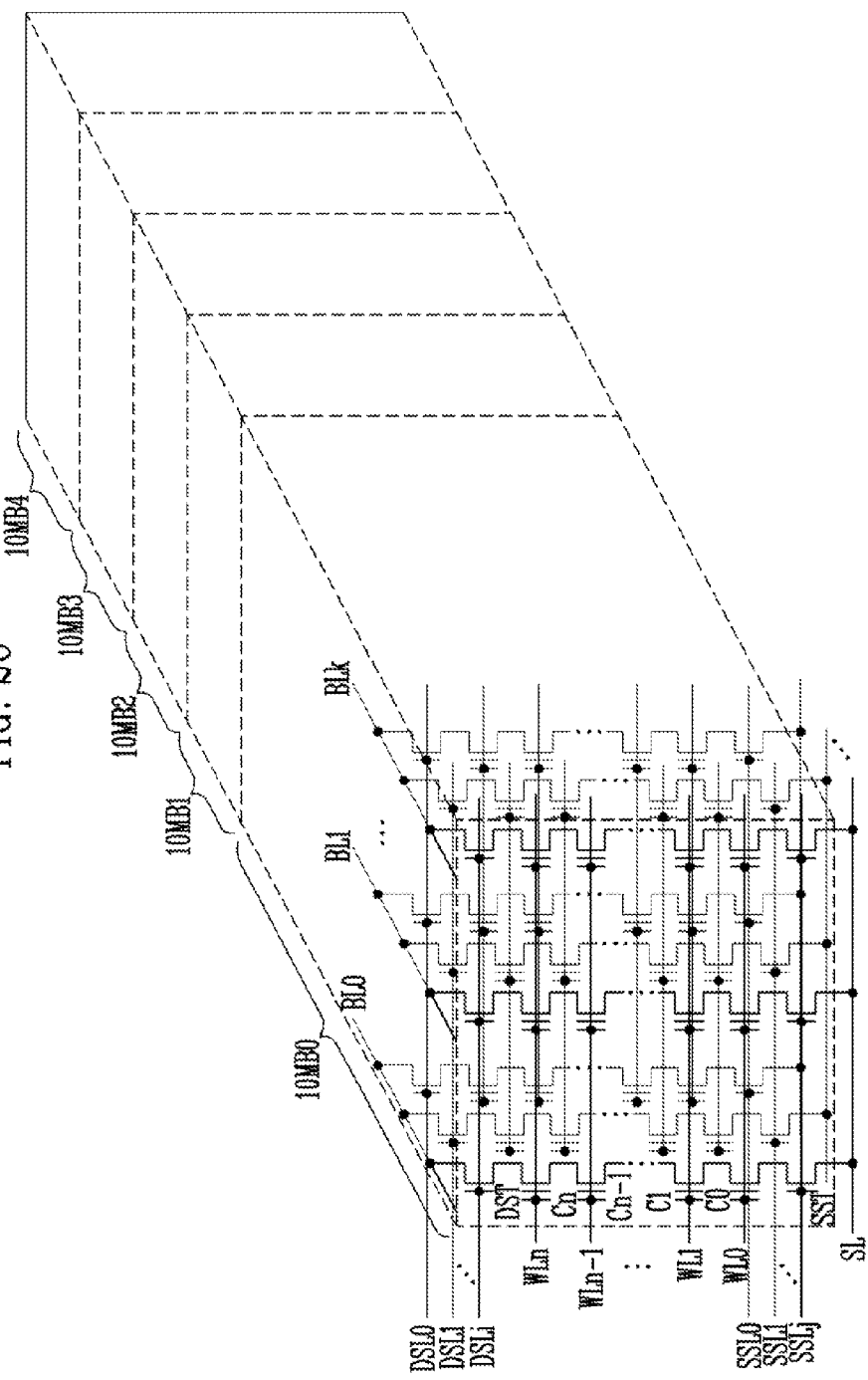

SEMICONDUCTOR DEVICE

CROSS-REFERENCE TO RELATED APPLICATION

The present application claims priority to Korean Patent Application Number 10-2014-0132630, filed on Oct. 1, 2014, the entire disclosure of which is herein incorporated by reference in its entirety.

BACKGROUND

1. Field of Invention

Various embodiments of the present invention relate to a semiconductor device and, more specifically, to a semiconductor device including a memory string.

2. Description of Related Art

A memory string of three-dimensional structure includes memory cells, vertically stacked on a substrate, and select transistors. Unlike the two-dimensional structure, a select transistor having a three-dimensional structure may be formed using the same structure as a memory cell. That is, the select transistor may include a charge storage layer. For this reason, an erase operation, a program operation and a verify operation may be performed to adjust the threshold voltage of the select transistor. Due to features of the three-dimensional structure, an error may occur when a verify operation on the select transistor is performed.

SUMMARY

Various embodiments of the present invention are directed to a semiconductor device capable of improving operation features and reliability.

According to an embodiment of the present invention, a semiconductor device includes memory strings, each including a drain select transistor, memory cells and a source select transistor, which are connected between a bit line and a common source line and suitable for operating based on voltages applied to a drain select line, word lines and a source select line, respectively, and an operation circuit suitable for performing a pre-program operation, an erase operation and a post-program operation on the memory strings. The operation circuit sequentially performs erase operations on drain select transistors included in the memory strings.

According to an embodiment of the present invention, a semiconductor device includes memory strings each including a drain select transistor, memory cells and a source select transistor, which are connected between a bit line and a common source line and suitable for operating based on voltages applied to a drain select line, word lines and a source select line, respectively, and an operation circuit suitable for performing a pre-program operation, an erase operation and a post-program operation on the memory strings. The operation circuit simultaneously performs an erase operation on the drain select transistor included in a first memory string among the memory strings when erase operations are performed on the memory cells included in the memory strings.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 2A to 2C are diagrams illustrating a structure of a memory array according to an embodiment of the present invention;

DETAILED DESCRIPTION

Hereinafter, preferred exemplary embodiments of the present invention will be described with reference to the accompanying drawings. However, the present invention is not limited to the exemplary embodiments disclosed hereafter and may be implemented in various forms, and the scope of the present invention is not limited to the exemplary embodiments described in detail hereinafter. Rather, the exemplary embodiments are provided to complete the disclosure of the present invention and to fully inform the scope of the invention to those skilled in the art, and the scope of the present invention will be understood by claims of the present specification.

It is also noted that in this specification, "connected/coupled" refers to one component not only directly coupling another component but also indirectly coupling another component through an Intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to where the first layer is formed directly on the second layer or the substrate but also to where a third layer exists between the first layer and the second layer or the substrate.

Figure 1:
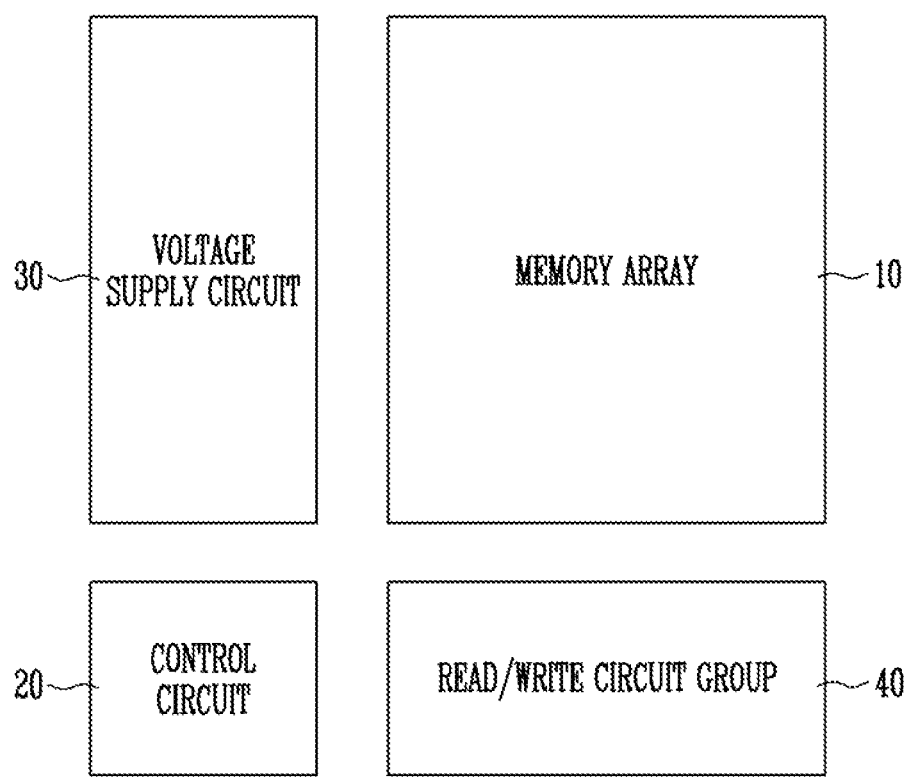
FIG. 1 is a block diagram illustrating a semiconductor device according to an embodiment of the present invention.

FIG. 1 is a block diagram illustrating a semiconductor device according to an embodiment of the present invention.

Referring to FIG. 1, the semiconductor device may include a memory array 10 and operation circuits 20, 30 and 40. The memory array 10 includes a plurality of memory blocks (not shown). Each of the memory blocks includes a plurality of memory strings (not shown). Each of the memory strings includes a plurality of memory cells (not shown). In the case of flash memory, a memory block may include a flash memory cell. For example, the memory block may include flash memory cells each including a poly-silicon floating gate or a nitride charge storage layer.

In particular, the memory block may include memory strings each connected to respective bit lines (not shown) and connected in parallel to a common source line (not shown). The memory strings may be formed by a two-dimensional structure or a three-dimensional structure on a semiconductor substrate. A memory block including a memory string of the three-dimensional structure will be described in detail.

In addition, the operation circuit may include a control circuit 20, a voltage supply circuit 30 and a read/write circuit 40.

Figure 2A:
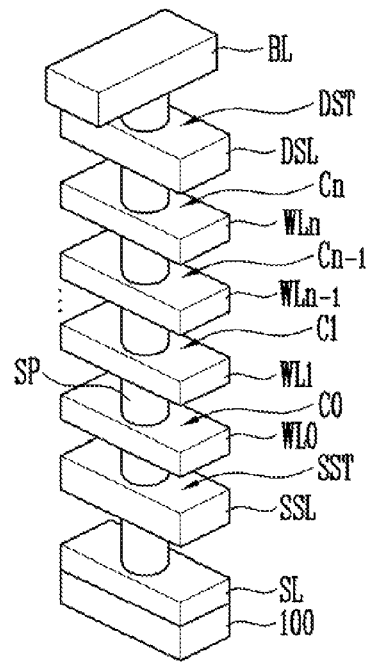
Figure 2B:
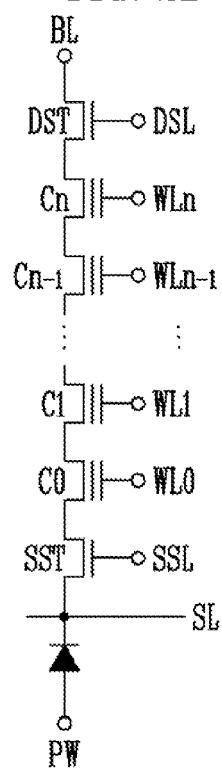

FIGS. 2A to 2C are diagrams illustrating a structure of a memory array according to an embodiment of the present invention.

Referring to FIGS. 2A and 2B, a common source line SL is formed on a semiconductor substrate 100 in which a P-well PW is formed. A vertical channel layer SP is formed on the common source line SL. An upper portion of the vertical channel layer SP is connected to a bit line BL. The vertical channel layer SP may include poly-silicon. A plurality of conductive layers SSL, WL0 to WLn and DSL may be formed to surround the vertical channel layer SP at different heights of the vertical channel layer SP. A multilayer layer (not shown) including a charge storage layer may be formed on a surface of the vertical channel layer SP, and the multilayer layer may be located between the vertical channel layer SP and the conductive layers SSL, WL0 to WLn and DSL.

A lowermost conductive layer is a source select line SSL, and an uppermost conductive layer is a drain select line DSL. Conductive layers between the select lines SSL and DSL are word lines WL0 to WLn. In other words, the conductive layers SSL, WL0 to WLn and DSL are formed as multilayers on the semiconductor substrate, and the vertical channel layer SP passing through the conductive layers SSL, WL0 to WLn and DSL is vertically connected between a source line SL formed on the semiconductor substrate and the bit line BL.

A drain select transistor DST is formed at a portion in which the uppermost conductive layer DSL surrounds the vertical channel layer SP, and a source select transistor SST is formed at a portion in which the lowermost conductive layer SSL surrounds the vertical channel layer SP. Memory cells C0 to Cn are formed at portions in which intermediate conductive layers WL0 to WLn surround the vertical channel layer SP.

By the above structure, a memory string includes the source select transistor SST, the memory cells C0 to Cn, and the drain select transistor DST vertically connected to the substrate between the common source line SL and the bit line BL. The source select transistor SST electrically connects the memory cells C0 to Cn with the common source line SL according to voltages applied to the source select line SSL. The drain select transistor DST electrically connects the memory cells C0 to Cn with the bit line BL according to voltages applied to the drain select line DSL.

Referring to FIG. 2C, a plurality of memory blocks 10MB0 to 10MB4 (for convenience of description, only five are shown) may be arranged in a direction of the bit line on the substrate (not shown). Each of the memory blocks 10MB0 to 10MB4 includes memory strings connected between bit lines BL0 to BLk and the common source line SL. The memory blocks 10MB0 to 10MB4 share the bit lines BL0 to BLk, and the common source line SL in each of the memory blocks 10MB0 to 10MB4 may be connected to each other or may be separated. The bit lines BL0 to BLk extend in a direction that is parallel to a direction in which the memory blocks 10MB0 to 10MB4 are arranged.

In each of the memory blocks 10MB0 to 10MB4, a plurality of memory strings may be connected to each of the bit lines BL0 to BLk. Each of the memory strings includes the source select transistor SST connected to the common source line SL, the drain select transistor DST connected to the bit line BL0, and the memory cells C0 to Cn vertically connected in series between the select transistors SST and DST.

In the memory block (e.g., 10MB0), the memory cells C0 to Cn each included in the respective memory strings share the word lines WL0 to WLn. That is, the word lines WL0 to WLn corresponding to the memory cells C0 to Cn in the respective memory strings are connected to each other. In other words, in the memory block (e.g., 10MB0), word lines of horizontally adjacent memory cells which are formed in a same layer are connected to each other.

In the memory block (e.g., 10MB0), drain select transistors DST of memory strings each connected to the respective bit lines BL0 to BLk share a drain select line (e.g., DSL0). That is, drain select lines (e.g., DSL0) of the drain select transistors DST of the memory strings each connected to the respective bit lines BL0 to BLk are connected to each other. On the other hand, drain select transistors DST of memory strings connected to a same bit line (e.g., BL0) in the memory block (e.g., 10MB0) may have different drain select lines DSL0 to DSLi. That is, the drain select lines DSL0 to DSLi of the drain select transistors DST of the memory strings connected to the same bit lines (e.g., BL0) may be separated from each other. Accordingly, drain select transistors DST connected to the same bit line BL0 may independently operate with different operating voltages. These drain select lines DSL0 to DSLi may extend in a direction crossing the bit lines BL0 to BLk.

On the other hand, only a single drain select transistor may be connected to a bit line in each of the memory strings. When a single drain select transistor is connected, the drain select line may be formed thicker than a word line. In addition, a plurality of drain select transistors may be connected in series. In this case, a plurality of drain select lines may be stacked, and the stacked drain select lines may be electrically connected to each other. That is, gates of the drain select transistors vertically connected in series may be connected to each other.

In the memory block (e.g., 10MB0), source select transistors SST of memory strings each connected to the respective bit lines BL0 to BLk share a source select line (e.g., SSL0). That is, source select lines (e.g., SSL0) of source select transistors SST of the memory strings each connected to the respective bit lines BL0 to BLk are connected to each other. However, source select transistors SST of memory strings connected to a same bit line (e.g., BL0) in the memory block (e.g., 10MB0) may have different source select lines SSL0 to SSLj. That is, source select lines SSL0 to SSLj of the source select transistors SST of the memory strings connected to the same bit line (e.g., BL0) may be separated from each other. Accordingly, source select transistors SST connected to the same bit line BL0 may independently operate with different operating voltages. These source select lines SSL0 to SSLj may extend in a direction crossing the bit lines BL0 to BLk.

In contrast, all of the source select lines SSL0 to SSLj may be connected to each other in the memory block 10MB0 in accordance with a design change. In addition, operating voltages applied to the memory blocks may vary according to the connection status of the source select lines SSL0 to SSLj in the memory block 10MB0 at the time of a read operation, a program operation and an erase operation.

On the other hand, source select lines SSL0 to SSLj, word lines WL0 to WLn, drain select lines DSL0 to DSLi, and common source lines SL of the memory block (e.g., 10MB0) are separated with source select lines (not shown), word lines (not shown), drain select lines (not shown), and common source lines (not shown) of a memory block (e.g., 10MB1).

Figure 3A:
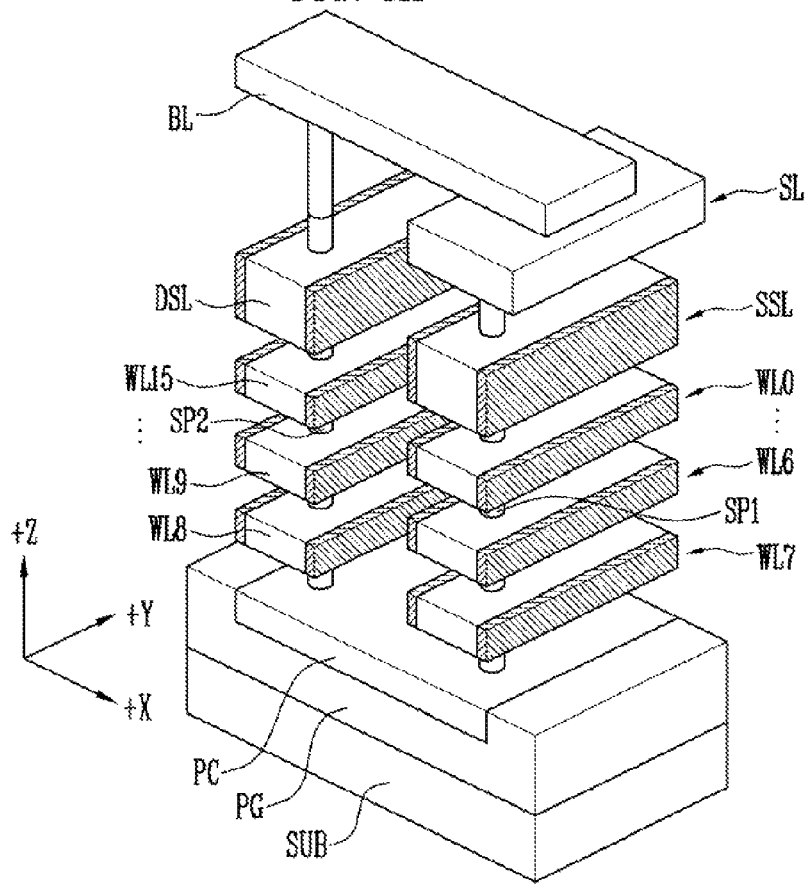
FIGS. 3A to 3C are diagrams illustrating a structure of a memory array according to an embodiment of the present invention.
Figure 3B:
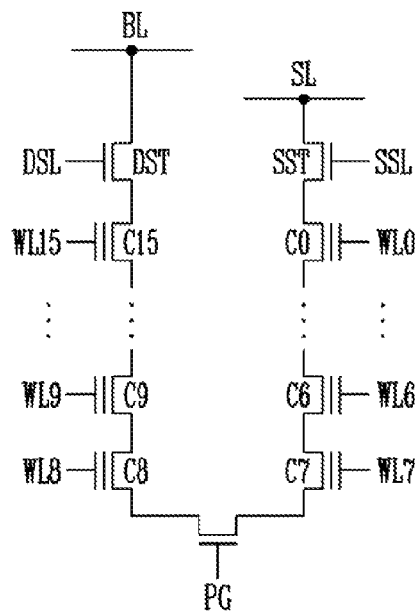
Figure 3C:
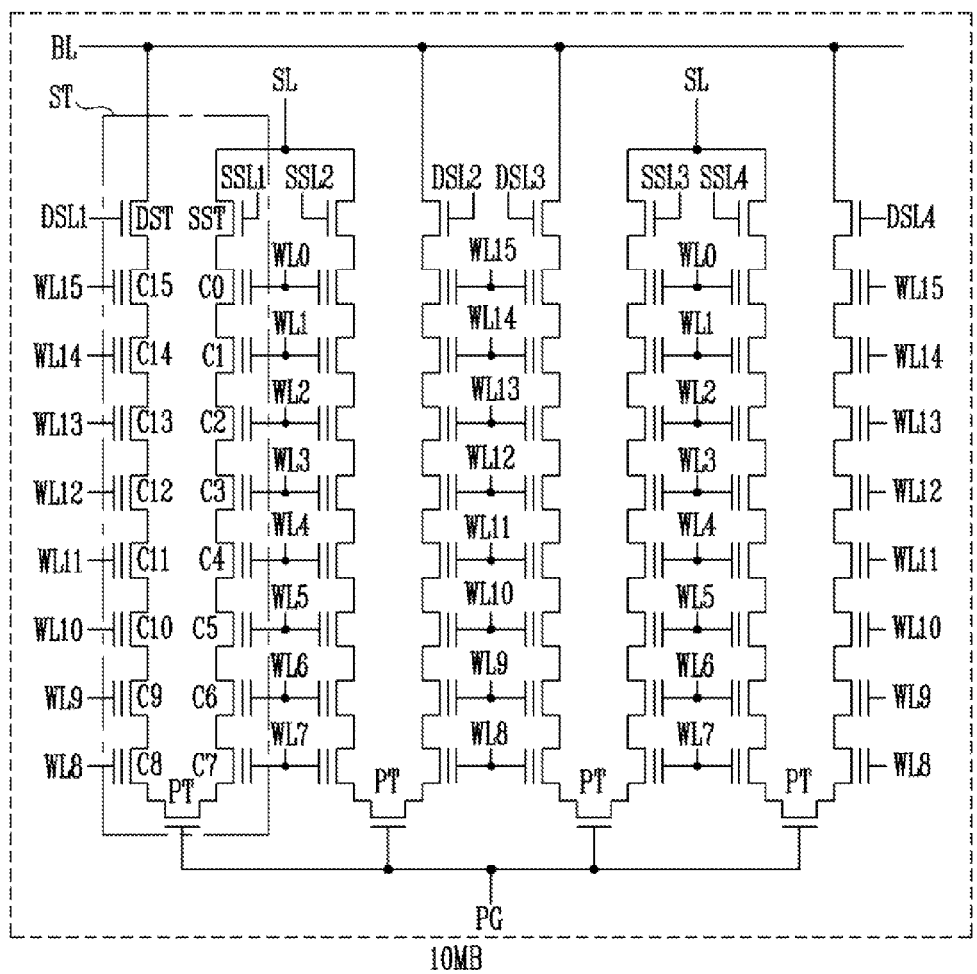

FIGS. 3A to 3C are diagrams illustrating a structure of a memory array according to an embodiment of the present invention.

Referring to FIGS. 3A and 3B, a pipe gate PG including a recess portion is formed on a semiconductor substrate SUB, and a pipe channel layer PC is formed in the recess portion of the pipe gate PG. A plurality of vertical channel layers SP1 and SP2 are formed on the pipe channel layer PC. An upper portion of the first vertical channel layer SP1 of the pair of the vertical channel layers is connected to a common source line SL, and an upper portion of the second vertical channel layer SP2 is connected to a bit line BL. The vertical channel layers SP1 and SP2 may be formed of poly-silicon.

A plurality of conductive layers DSL and WL15 to WL8 are formed to surround the second vertical channel layer SP2 at different heights of the second vertical channel layer SP2. In addition, a plurality of conductive layers SSL and WL0 to WL7 are formed to surround the first vertical channel layer SP1 at different heights of the first vertical channel layer SP1. A multilayer layer (not shown) including a charge storage layer is formed on surfaces of the vertical channel layers SP1 and SP2 and on a surface of the pipe channel layer PC, and the multilayer layer is also located between the vertical channel layers SP1 and SP2 and the conductive layers DSL, WL15 to WL8, SSL and WL0 to WL7 and between the pipe channel layer PC and the pipe gate PG.

An uppermost conductive layer surrounding the second vertical channel layer SP2 may be a drain select line DSL, and conductive layers under the drain select line DSL may be word lines WL15 to WL8. An uppermost conductive layer surrounding the first vertical channel layer SP1 may be a source select line SSL, and conductive layers under the source select line SSL may be word lines WL0 to WL7.

In other words, first conductive layers SSL and WL0 to WL7 and second conductive layers DSL and WL15 to WL8 are respectively stacked in different areas of the semiconductor substrate. The vertical channel layer SP1 passing through the first conductive layers SSL and WL0 to WL7 is vertically connected between the source line SL and the pipe channel layer PC. The second vertical channel layer SP2 passing through the second conductive layers DSL and WL15 to WL8 is vertically connected between the bit line BL and the pipe channel layer PC.

A drain select transistor DST is formed at a portion in which the drain select line DSL surrounds the second vertical channel layer SP2, and memory cells C15 to C8 are respectively formed at portions in which the word lines WL15 to WL8 surround the second vertical channel layer SP2. A source select transistor SST is formed at a portion in which the source select line SSL surrounds the first vertical channel layer SP1, and memory cells C0 to C7 are respectively formed at portions in which the word lines WL0 to WL7 surround the first vertical channel layer SP1.

By the above structure, a memory string ST may include the drain select transistor DST and the memory cells C15 and C8 vertically connected to the substrate between the bit line BL and the pipe channel layer PC, and the source select transistor SST and the memory cells C0 to C7 vertically connected with the substrate between the common source line SL and the pipe channel layer PC.

Although a case in which 16 main word lines WL0 to WL15 are formed has been described above, the number of main word lines may vary. In addition, dummy word lines (not shown) may be formed between the drain select line DSL and the word line WL15 and between the source select line SSL and the word line WL0, respectively. That is, dummy memory cells may further be connected between the drain select line DSL and the memory cell C15 and between the source select transistor SST and the memory cell C0, respectively.

Referring to FIG. 3C, a memory block 10MB includes a plurality of memory strings ST connected to bit lines. As described in FIG. 3A, each of the memory strings ST includes a first vertical memory string SST and C0 to C7 vertically connected between the common source line SL, a pipe transistor PT formed on the substrate, and a second vertical memory string DST and C15 to C8 vertically connected between the bit line BL and the pipe transistor PT formed on the substrate in a U-shaped structure where the pipe channel PC exists. The first vertical memory string SST and C0 to C7 includes a source select transistor SST and memory cells C0 to C7. The source select transistor SST is controlled by voltages applied to a source select line SSL1, and the memory cells C0 to C7 are controlled by voltages applied to stacked word lines WL0 to WL7. The second vertical memory string DST and C15 to C8 includes a drain select transistor DST and memory cells C8 to C15. The drain select transistor DST is controlled by voltages applied to a drain select line DSL1, and the memory cells C8 to C15 are controlled by voltages applied to word lines WL8 to WL15.

As described above, only a single drain select transistor may be connected to the bit line, however, a plurality of drain select transistors sharing gates may be connected. In addition, only a single source select transistor may be connected to the common source line, however, a plurality of source select transistor that share gates may be connected.

When a memory block 10MB is selected, the pipe transistor PT, connected between a pair of memory cells C7 and C8 intermediately-located in a memory string of a U-shaped structure in which a pipe channel is formed, performs an operation to electrically connect channel layers of the first vertical memory string SST and C0 to C7 and channel layers of the second vertical memory string DST and C15 to C8 included in the selected memory block 10MB.

On the other hand, although a single memory string was connected to each bit line and drain select transistors of a memory block were simultaneously controlled by a single drain select line in a memory block of two-dimensional structure, a plurality of memory strings ST are commonly connected to each bit line BL in the memory block 10MB of the three-dimensional structure. The number of the memory strings ST commonly connected to a single bit line BL and controlled by the same word lines in the same memory block 10MB may change in accordance with the design.

As a plurality of memory strings are connected to a single bit line BL in parallel, drain select transistors DST are independently controlled by select voltages applied to drain select lines DSL1 to DSL4 to selectively connect the single bit line BL with the memory strings ST.

The memory cells C0 to C7 of the first vertical memory string SST and C0 to C7 and the memory cells C8 to C15 of the second vertical string DST and C15 to C8, which are vertically connected in the memory block 10MB, are respectively controlled by operating voltages applied to the stacked word lines WL0 to WL15. These word lines WL0 to WL15 are divided by memory block units.

Select lines DSL0 to DLS4, and SSL0 to SSL4 and word lines WL0 to WL15 are local lines of the memory block 10MB. In particular, source select lines SSL0 to SSL4 and word lines WL0 to WL7 may be local lines of the first vertical memory string, and drain select lines DSL0 to DSL4 and word lines WL15 to WL7 may be local lines of the second vertical memory string. On the other hand, gates PG of pipe transistors PT may be commonly connected in the memory block 10MB.

Referring to FIGS. 1 and 3B again, the operation circuits 20, 30 and 40 may perform a program loop, an erase loop and read operation on memory cells (e.g., C0) connected to selected word lines (e.g., WL0). The program loop includes a program operation and a verify operation, and the erase loop includes an erase operation and a verify operation. In particular, the operation circuits 20, 30 and 40 may perform a program operation (or a pre-program operation) for increasing threshold voltages of memory cells, which are distributed before the erase loop. In addition, the operation circuits 20, 30 and 40 may perform a program operation (or a post-program operation) for adjusting an erase level in which threshold voltages of memory cells are distributed after the erase loop.

In order to perform the program loop, the erase loop and the read operation, the operation circuits 20, 30 and 40 may selectively output operating voltages to local lines SSL, WL0 to WL15, PG and DSL and the common source line SL of a selected memory block, and to control precharging/discharging of bit lines BL or sense current flows (or voltage change) of the bit lines BL.

In case of a NAND flash memory, the operation circuit includes the control circuit 20, the voltage supply circuit 30 and the read/write circuit 40.

The control circuit 20 generates operating voltages at desired levels to perform a program loop, an erase loop and a read operation, and controls the voltage supply circuit 30 such that the operating voltages may be applied to local lines SSL, WL0 to WL15, PG and DSL and a common source line SL of a selected memory block, in response to a command signal input from an external device. And, the control circuit 20 controls precharging/discharging of bit lines BL according to data to be stored in memory cells in order to perform the program loop, the erase loop and the read operation, or controls the read/write circuit 40 such that current flows (or voltage changes) of bit lines BL may be sensed in a read operation or a verify operation.

The voltage supply circuit 30 generates operating voltages required in the program loop, the erase loop and the read operation on memory cells under the control of the control circuit 20. Here, the operating voltages may include program voltages, read voltages, erase voltages, pass voltages, select voltages, common source voltages and pipe gate voltages, etc. And, the voltage supply circuit 30 outputs operating voltages to local lines SSL, WL0 to WL15, PG and DSL and a common source line SL of a selected memory block, in response to a low address signal (not shown) of the control circuit 20.

The read/write circuit 40 may include a plurality of page buffers (not shown) connected to the memory array 10 through bit lines BL, respectively. In particular, the page buffers may be connected to the bit lines BL, respectively. That is, a single page buffer may be connected to a single bit line. In a program operation, the page buffers selectively precharge the bit lines BL according to a control signal of the control circuit 20 and data to be stored in memory cells. In a program verify operation or a read operation, the read/write circuit 40 senses voltage changes or currents of the bit lines BL and latches data read from a memory cell after precharging the bit lines BL, in accordance with the control of the control circuit 20.

Figure 4:
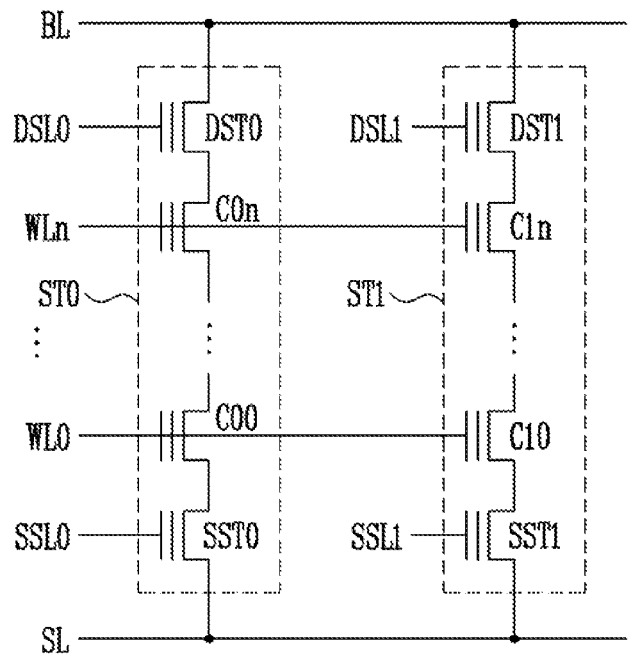
FIG. 4 is a circuit diagram illustrating a method of operating a semiconductor device according to an embodiment of the present invention.
Figure 5:
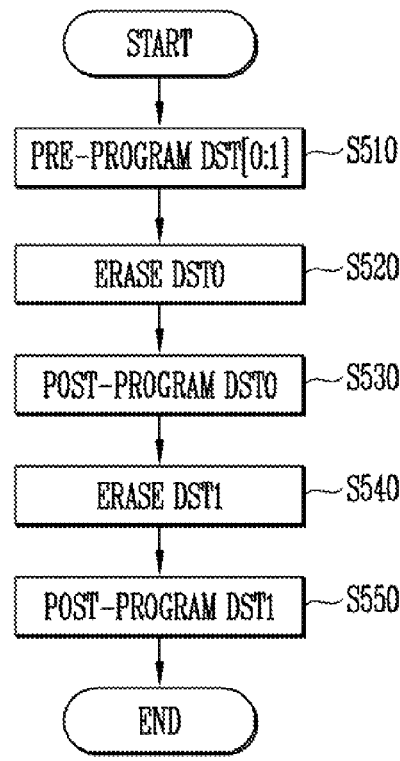
FIG. 5 is a flow chart illustrating a method of operating a semiconductor device according to an embodiment of the present invention.
Figure 6A:
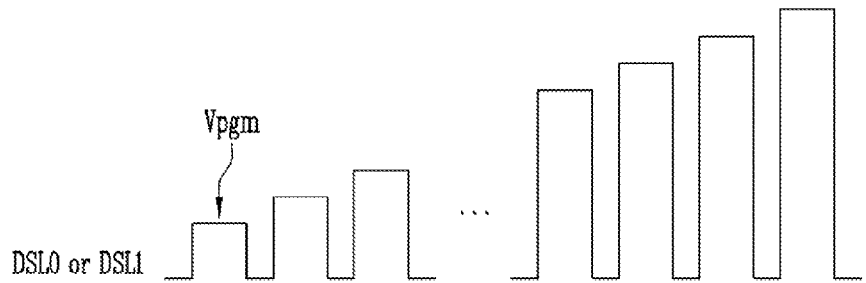
FIGS. 6A to 6C are waveform diagrams illustrating a program operation on a semiconductor device according to an embodiment of the present invention.
Figure 6B:
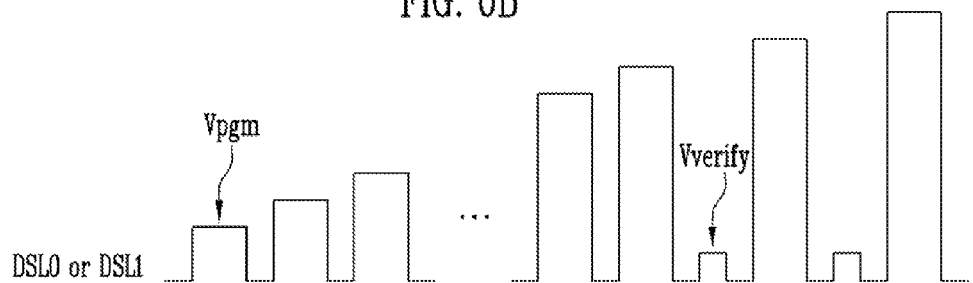
Figure 6C:
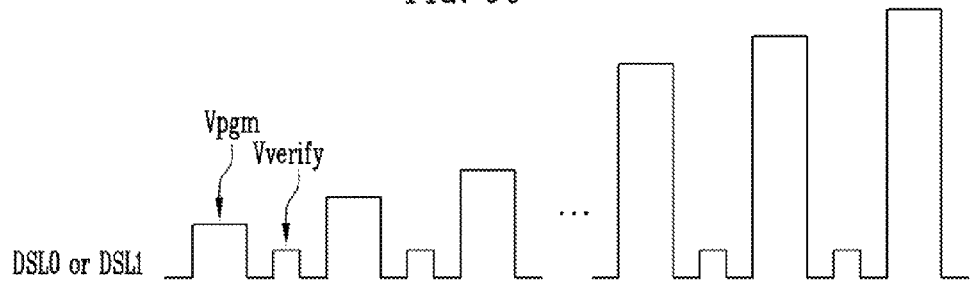
Figure 7:
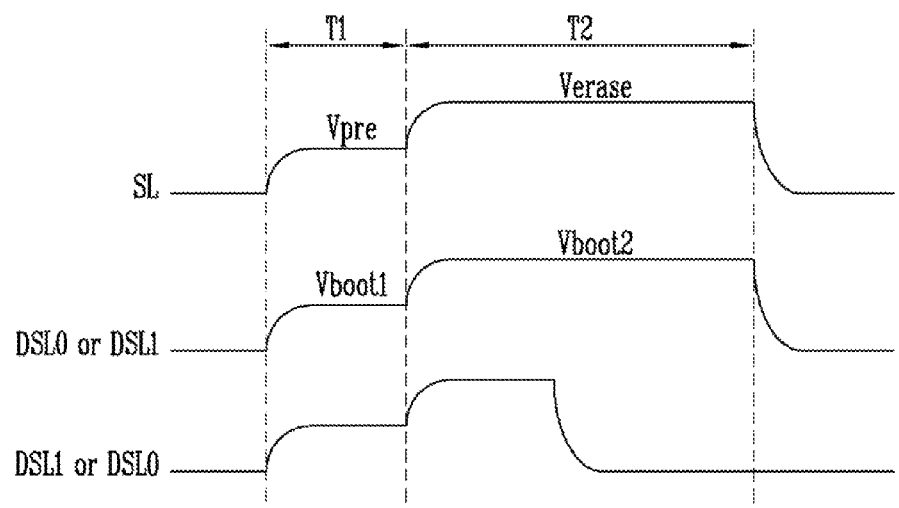
FIG. 7 is a waveform diagram illustrating an erase operation on a semiconductor device according to an embodiment of the present invention.

Hereinafter, an operation method of a semiconductor device including the above-mentioned elements will be described. FIG. 4 is a circuit diagram illustrating a method of operating a semiconductor device according to an embodiment of the present invention. FIG. 5 is a flow chart illustrating a method of operating a semiconductor device according to an embodiment of the present invention. FIGS. 6A to 6C are waveform diagrams illustrating a program operation on a semiconductor device according to an embodiment of the present invention. FIG. 7 is a waveform diagram illustrating an erase operation on a semiconductor device according to an embodiment of the present invention.

Referring to FIGS. 4 and 5, an erase operation is performed on drain select transistors DST0 and DST1 included in memory strings ST0 and ST1 (for convenience of description, only two memory strings connected to a same bit line are shown). The memory strings ST0 and ST1 are included in the same memory block. In a two-dimensional structure, unlike memory cells C00 to C0n, and C10 to C1n, select transistors DST0, DST1, SST0 and SST1 are formed by a conventional transistor structure not including a floating gate or a charge storage layer. However, according to a manufacturing process of a three-dimensional structure, the select transistors DST0, DST1, SST0 and SST1 may be formed by the same structure as the memory cells C00 to C0n, and C10 to C1n. In this case, the select transistors DST0, DST1, SST0 and SST1 may also include charge storage layers, and an erase operation or a program operation has to be performed to adjust threshold voltages of the drain select transistors DST0 and DST1. An erase operation on a drain select transistor may be simultaneously performed with erase operations on memory cells C00 to C0n, and C10 to C1n. A more particular description is as follows.

In step S510, an operation circuit may perform pre-program operations on the drain select transistors DST0 and DST1 before erase operations on the drain select transistors DST0 and DST1. The pre-program operations may be simultaneously performed on the drain select transistors DST0 and DST1. The pre-program operations may be performed to increase a threshold voltage of a drain select transistor of which the threshold voltage is lowered, and to minimize a difference between threshold voltages of the drain select transistors DST0 and DST1.

In order to perform the pre-program operations on the drain select transistors DST0 and DST1 included in memory strings ST0 and ST1, the operation circuit may continuously apply pre-program pulses (Vpgm in FIG. 6A) that gradually increases to drain select lines DSL0 and DSL1 at a predetermined number of times. Although a verify operation is performed after a program pulse is applied in a conventional program operation, the verify operation may be omitted in the pre-program operation on the drain select transistor.

Relatively low threshold voltages increase more than high threshold voltages when the pre-program operations are performed. Thus, a difference between threshold voltages of the drain select transistors DST0 and DST1 may be reduced.

However, such pre-program operations on the drain select transistors DST0 and DST1 may be omitted.

Then, erase operations are performed on the drain select transistors DST0 and DST1. The operation circuit sequentially performs erase operations on the drain select transistors DST0 and DST1 included in memory strings ST0 and ST1, respectively.

In step S520, the operation circuit performs an erase operation on the drain select transistor DST0 included in the first memory string ST0. Erase operations may be simultaneously performed on memory cells C00 to C0n and C10 to C1n included in the memory block when the erase operation is performed on the drain select transistor DST0. That is, the operation circuit may perform the erase operation on the drain select transistor DST0 included in the first memory string ST0 when erase operations are performed on the memory cells C00 to C0n and C10 to C1n included in the memory strings ST0 and ST1.

The operation circuit applies voltages for erase operations to a common source line SL. First, as illustrated in FIG. 7, the operation circuit applies a positive voltage Vpre to the common source line SL to generate a gate induced drain leakage (GIDL) current at a first section T1. In this case, the operation circuit may set the other lines DSL0, DSL1, WL0 to WLn, SSL0 and SSL1 to a floating state. Electric potentials Vboot1 of the other lines DSL0, DSL1, WL0 to WLn, SSL0 and SSL1 in the floating state increase together according to voltage changes of the common source line SL by a coupling phenomenon.

The operation circuit increases the positive voltage Vpre of the common source line SL to the level of an erase voltage Verase in a second section T2. Accordingly, electric potentials Vboot2 of the lines DSL0, DSL1, WL0 to WLn, SSL0 and SSL1 in the floating state increase together by the coupling phenomenon.

Then, a ground voltage (e.g., 0 V) is applied to the drain select line DLS0 and word lines WL0 to WLn. As a result, a threshold voltage of the drain select transistor DST0 is lowered by a high voltage difference between the drain select line DLS0 and the common source line SL. In the same way, threshold voltages of the memory cells C00 to C0n, and C10 to C1n are lowered by a high voltage difference between the word lines WL0 to WLn and the common source line SL.

However, a threshold voltage of the drain select transistor DST1 is not lowered since a voltage difference between the common source line SL and the drain select line DLS1 maintaining the floating state is small.

Then, verify operations (i.e., erase verify operations) on the memory cells C00 to C0n, and C10 to C1n may be performed. In this case, a verify operation (i.e., an erase verify operation) on the drain select transistor DST0 may also be performed.

In S530, before an erase operation is performed on the drain select transistor DST1 included in the subsequent memory string (i.e., a second memory string) ST1, the operation circuit performs a post-program operation to increase the threshold voltage of the drain select transistor DST0 in which the erase operation has been performed, to a target level. The operation circuit may perform a verify operation (I.e., post-program verify operation) after performing the post-program operation. In particular, as illustrated in FIG. 6B, the operation circuit may apply voltages for the verify operation Vverify after applying gradually increasing program pulses Vpgm to the drain select line DSL0 at a predetermined number of times. In addition, as illustrated in FIG. 6C, the operation circuit may repeatedly perform the post-program operation and the verify operation from the beginning until the threshold voltage of the drain select transistor DST0 reaches a target level.

In the verify operation, the operation circuit senses a voltage change of a bit line BL after precharging the bit line BL and applying the verify voltage Vverify to the drain select line DSL0. In this case, when the drain select transistor DST1 is in an erase state, the voltage of the bit line BL is discharged to the common source line SL through the drain select transistor DST1 and the memory cells C10 to C1n although the threshold voltage of the drain select transistor DST0 reaches the target level thereby being turned off. Thus, the voltage of the bit line BL may be abnormally lowered regardless of the threshold voltage of the drain select transistor DST0. For this reason, the operation circuit may determine that the threshold voltage of the drain select transistor DST0 is lower than the target level according to the lowered voltage of the bit line BL, and may additionally perform the post-program operation on the drain select transistor DST0. As a result, the threshold voltage of the drain select transistor DST0 may be excessively increased, and an overall threshold voltage distribution of the drain select transistors DST0 and DST1 may be widened.

However, since the drain select transistor DST1 is not in an erase state and is only in a pre-programmed state in step S520, the bit line BL is not abnormally discharged to the common source line SL through the drain select transistor DST1 and the memory cells C10 to C1n. Thus, the operation circuit may exactly sense the threshold voltage of the drain select transistor DST0, and may narrow the threshold voltage distribution of the drain select transistors DST0 and DST1.

In step S540, an erase operation is performed on the drain select transistor DST1 included in the subsequent memory string ST1. The erase operation may be performed on the drain select transistor DST1 in the same way as the erase operation on the drain select transistor DST0 illustrated in step S520. However, the memory cells C00 to C0n, and C10 to C1n are not in erase states in the erase operation of the drain select transistor DST1.

In step S550, a post-program operation and a verify operation are performed on the drain select transistor DST1. The post-program operation and the verify operation may be performed on the drain select transistor DST1 in the same way as the post-program operation and the verify operation on the drain select transistor DST0 illustrated in step S530. Since the post-program operation on the drain select transistor DST0 has been completed, the bit line BL is not abnormally discharged to the common source line SL through the drain select transistor DST0 and the memory cells C00 to C0n in the verify operation on the drain select transistor DST1. Thus, the operation circuit may exactly sense the threshold voltage of the drain select transistor DST1, and may narrow the threshold voltage distribution of the drain select transistors DST0 and DST1.

As mentioned above, erase operations may be sequentially performed on the drain select transistors DST0 and DST1 included in the memory strings ST0 and ST1, thereby preventing the threshold voltage distribution of the drain select transistors DST0 and DST1 from widening.

Figure 8:
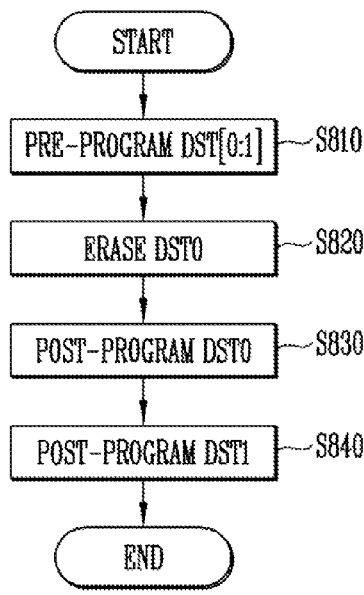
FIG. 8 is a flow chart Illustrating a method of operating a semiconductor device according to an embodiment of the present invention.

FIG. 8 is a flow chart illustrating a method of operating a semiconductor device according to an embodiment of the present invention.

Referring to FIGS. 4 and 8, in step S810, the operation circuit may perform pre-program operations on the drain select transistors DST0 and DST1 before erase operations on the memory cells C00 to C0n and C10 to C1n are performed. The pre-program operation may be performed on the drain select transistors DST0 and DST1 in the same way as the pre-program operation illustrated in step S510 in FIG. 5. However, although a verify operation has not been performed in step S510, pre-program operations and verify operations (i.e., pre-program verify operations) of the drain select transistors DST0 and DST1 are performed in step S810, using the program voltage Vpgm and the program verify voltage Vverify, as illustrated in FIG. 6B or 6C.

In performing the verify operations, threshold voltages of the drain select transistors DST0 and DST1 may be exactly controlled to increase lower threshold voltages to a target level.

In S820, the operation circuit performs an erase operation on the drain select transistor DST0 included in the first memory string ST0. Erase operations are also performed on memory cells C00 to C0$n$ and C10 to C1$n$ included in the memory block when the erase operation is performed on the drain select transistor DST0. That is, the operation circuit performs the erase operation on the drain select transistor DST0 included in the first memory string ST0 when erase operations are performed on the memory cells C00 to C0$n$ and C10 to C1$n$ included in the memory strings ST0 and ST1. These erase operations may be performed in the same way as the erase operation illustrated in step S520 in FIG. 5.

In step S830, the operation circuit performs a post-program operation and a verify operation to increase a threshold voltage of the drain select transistor DST0, in which the erase operation has been performed, to a target level. The post-program operation and the verify operation may be performed on the drain select transistor DST0 in the same way as the post-program operation and the verify operation illustrated in step S530 in FIG. 5.

Since the post-program operation and the verify operation are performed on the drain select transistor DST0 under a condition in which the drain select transistor DST1 is not in an erase state and is only pre-programmed, as illustrated in step S530, the bit line BL is not abnormally discharged to the common source line SL through the drain select transistor DST1 and the memory cells C10 to C1$n$. Thus, the operation circuit may prevent the threshold voltage of the drain select transistor DST0 from excessively increasing.

In step S840, the operation circuit omits an erase operation on the drain select transistor DST1 and performs a post-program operation and a verify operation. The post-program operation and the verify operation, while omitting the erase operation, of the drain select transistor DST1 may be performed in the same way as the post-program operation and the verify operation illustrated in step S550 in FIG. 5. Post-program operations and verify operations may be sequentially performed on the remaining drain select transistors except the first drain select transistor DST0. In addition, since erase operations are not performed on the remaining drain select transistors, the post-program operations and the verify operations may be simultaneously performed on the remaining drain select transistors.

Since the post-program operation on the drain select transistor DST0 has been completed, the bit line BL is not abnormally discharged to the common source line SL through the drain select transistor DST0 and the memory cells C00 to C0$n$ in the verify operation on the drain select transistor DST1. Thus, the operation circuit may exactly sense the threshold voltage of the drain select transistor DST1, and may narrow the threshold voltage distribution of the drain select transistors DST0 and DST1.

Figure 9:
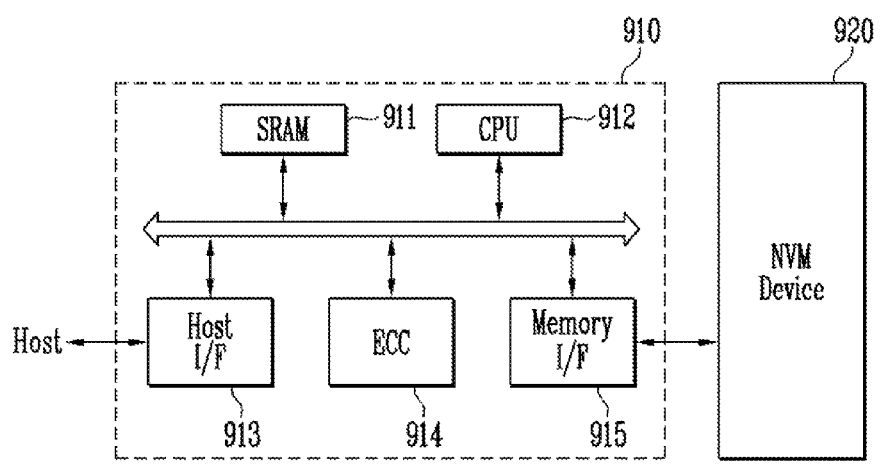
FIG. 9 is a block diagram briefly illustrating a memory system according to an embodiment of the present invention.

FIG. 9 is a block diagram Illustrating a memory system 900 according to an embodiment of the present invention.

Referring to FIG. 9, the memory system 900 may include a nonvolatile memory (NVM) device 920 and a memory controller 910. The NVM device 920 may be configured as the semiconductor device including the operation circuits illustrated in FIG. 1 and the memory strings in FIG. 2A or 3A described above.

That is, the memory controller 910 may control the NVM device 920. A combination of the NVM device 920 and the memory controller 910 may be provided as a memory card or a semiconductor disk device, e.g., a solid-state disk (SSD). The memory controller 910 may Include a static random access memory (SRAM) 911, a central processing unit (CPU) 912, a host interface (I/F) 913, an error correction code (ECC) 914, and a memory interface (I/F) 915.

The SRAM 911 is used as an operation memory of the CPU 912. The host interface 913 provides a data exchange protocol of a host connected to the memory system 900. The ECC 914 detects and corrects an error included in data read from the NVM device 920. The memory interface 915 interfaces with the NVM device 920. The CPU 912 performs the overall control operations for data exchange of the memory controller 910.

Although not illustrated in the drawings, the memory system 900 may be further provided with a read only memory (ROM) (not shown) which stores code data for interfacing with the host, etc. The NVM device 920 may be further provided by a multi-chip package consisting of a plurality of flash memory chips. The memory system 900 may be provided with a high-reliability storage medium having a low probability of generating errors. In particular, the flash memory of the embodiment of the present invention may be provided in a memory system such as a semiconductor disk device (e.g., an SSD). In this case, the memory controller 910 may communicate with an external device (e.g., a host) via one of various protocols such as USB, MMC, PCI-E, SATA, PATA, SCSI, ESDI, and IDE, etc.

Figure 10:
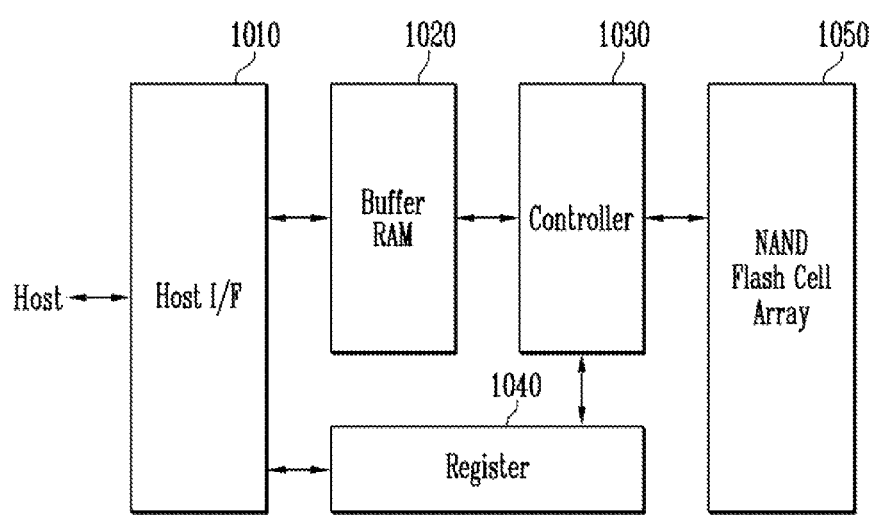
FIG. 10 is a block diagram briefly illustrating a fusion memory device or a fusion memory system performing program operations according to various embodiments aforementioned.

FIG. 10 is a block diagram illustrating a fusion memory device or a fusion memory system performing program operations according to various embodiments aforementioned. For example, the above-mentioned technical features of the semiconductor device may be applied to a one NAND flash memory 1000 as a fusion memory device.

The one NAND flash memory 1000 may include a host interface (I/F) 1010 for various data exchanges with a device using another protocol, a buffer RAM 1020 embedding codes for driving a memory device or temporarily storing data, a controller 1030 controlling read, program operations and all conditions in response to control signals and commands provided from an external device, a register 1040 which stores data such as commands, addresses, and configurations defining system operation environments within the memory device, and a NAND flash cell array 1050 consisting of the NVM cell and the operation circuits including voltage supply circuits and read/write circuits, as illustrated in FIG. 1. A memory array including memory blocks illustrated in FIG. 2C or 3C may be applied as a memory array of the NAND flash cell array 1050.

Figure 11:
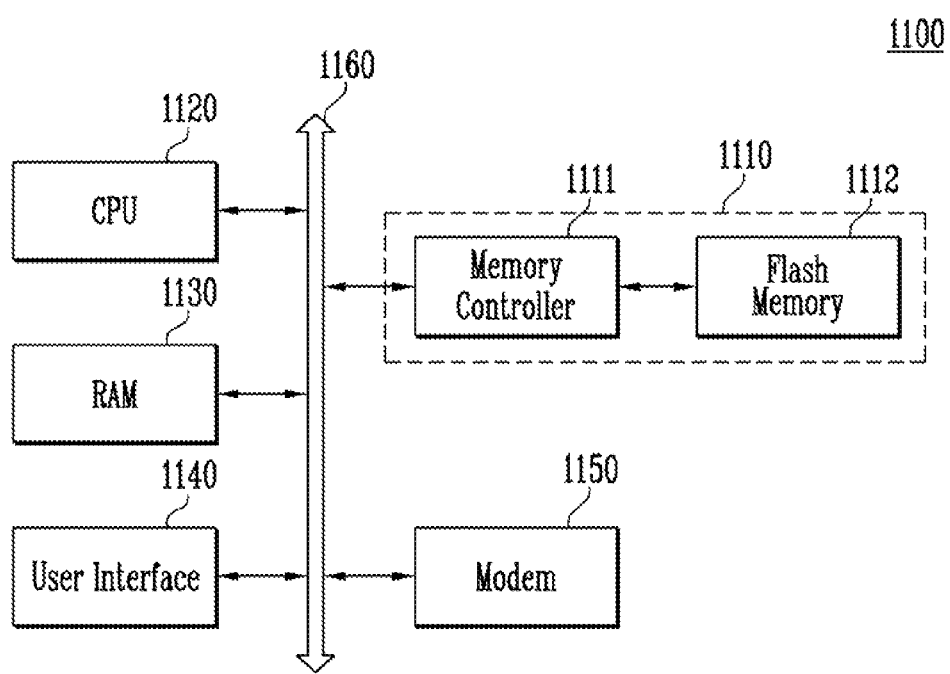
FIG. 11 is a block diagram briefly illustrating a computing system including a flash memory according to an embodiment of the present invention.

A computing system 1100 including a flash memory 1112 according to the present invention is briefly illustrated in FIG. 11.

The computing system 1100 may include a microprocessor (e.g., a CPU) 1120 electrically connected to a system bus 1160, a RAM 1130, a user interface 1140, a modem 1150 such as a baseband chipset, and a memory system 1110. The memory system 1110 may include a memory controller 1111 and a flash memory 1112. A battery (not shown) for supplying operating voltages of the computing system 1100 may be further provided if the computing system 1100 is a mobile device. Although not illustrated in the drawings, an application chipset, a camera image processor, a mobile DRAM, etc. may be further provided with the computing system 1100 according to the embodiments of the present invention. The memory system 1110 may consist of, for example, an SSD using the semiconductor device illustrated above, to store data. Alternatively, the memory system 1110 may be provided with a fusion flash memory (for example, a one NAND flash memory).

According to the embodiments of the present invention, the semiconductor device may improve operation features and reliability.

The present invention is explained with reference to the above exemplary embodiments. It will be apparent to those skilled in the art that various modifications can be made to the above-described exemplary embodiments of the present invention without departing from the spirit or scope of the invention. The scope of the present invention is to be defined solely by the appended claims, and it is intended that the present invention cover all such modifications provided they come within the scope of the claims and their equivalents.

What is claimed is:

1. A semiconductor device, comprising:
memory strings each including a drain select transistor, memory cells and a source select transistor, which are connected between a bit line and a common source line and suitable for operating based on voltages applied to a drain select line, word lines and a source select line, respectively; and
an operation circuit suitable for performing a pre-program operation, an erase operation and a post-program operation on the memory strings,
wherein the operation circuit sequentially performs erase operations on the drain select transistors included in the memory strings.

2. The semiconductor device of claim 1,
wherein the operation circuit performs a pre-program operation on the drain select transistors included in the memory strings before the erase operations on the drain select transistors are performed.

3. The semiconductor device of claim 2,
wherein the operation circuit continuously applies pre-program pulses, having voltage levels that gradually increase, to the drain select line at predetermined times to perform the pre-program on the drain select transistors.

4. The semiconductor device of claim 1,
wherein the operation circuit performs an erase operation on a drain select transistor included in a memory string selected first among the memory strings when the erase operations are performed on the memory cells included in the memory strings.

5. The semiconductor device of claim 1,
wherein the operation circuit performs an erase verify operation on a drain select transistor included in a selected memory string among the memory strings after performing an erase operation on the drain select transistor included in the selected memory string and before performing an erase operation on a drain select transistor included in a subsequent memory string.

6. The semiconductor device of claim 1,
wherein the operation circuit performs a post-program operation on a drain select transistor included in a selected memory string after performing an erase operation on the drain select transistor included in the selected memory string and before performing an erase operation on a drain select transistor included in a subsequent memory string.

7. The semiconductor device of claim 6,
wherein the operation circuit performs a verify operation whenever the post-program operation is performed while increasing program voltages applied to the drain select transistor.

8. The semiconductor device of claim 6,
wherein the operation circuit alternately performs the post-program operation and a post-program verify operation after performing the post-program operation a predetermined number of times while increasing program voltages applied to the drain select transistor.

9. The semiconductor device of claim 1,
wherein the operation circuit performs an erase operation on a drain select transistor included in a first memory string among the memory strings when an erase operation is performed on the memory cells included in the memory strings.

10. The semiconductor device of claim 9,
wherein the operation circuit performs a post-program operation and a post-program verify operation on the drain select transistor included in the first memory string after performing the erase operation on the drain select transistor included in the first memory string.

11. The semiconductor device of claim 10,
wherein the operation circuit performs a post-program operation and a post-program verify operation on a drain select transistor included in a subsequent memory string among the memory strings after completing the post-program operation and the post-program verify operation on the drain select transistor included in the first memory string.

12. The semiconductor device of claim 10,
wherein the operation circuit simultaneously performs a post-program operation and a post-program verify operation on drain select transistors included in the remaining memory strings after completing the post-program operation and the verify operation on the drain select transistor included in the first memory string.

13. A semiconductor device, comprising:
memory strings each including a drain select transistor, memory cells and a source select transistor, which are connected between a bit line and a common source line and suitable for operating based on voltages applied to a drain select line, word lines and a source select line, respectively; and
an operation circuit suitable for performing a pre-program operation, an erase operation and a post-program operation on the memory strings,
wherein the operation circuit performs an erase operation on the drain select transistor included in a first memory string among the memory strings when an erase operation is performed on the memory cells included in the memory strings.

14. The semiconductor device of claim 13,
wherein the operation circuit performs a pre-program operation on drain select transistors included in the memory strings before the erase operation on the drain select transistor included in the first memory string is performed.

15. The semiconductor device of claim 14,
wherein the operation circuit continuously applies pre-program pulses of which voltage levels gradually increase to the drain select line a predetermined number of times to perform the pre-program operation on the drain select transistors.

16. The semiconductor device of claim 15,
wherein the operation circuit performs a pre-program verify operation on the drain select transistors after applying the respective pre-program pulses.

17. The semiconductor device of claim 13,
wherein the operation circuit performs an erase verify operation after performing the erase operation on the drain select transistor included in the first memory string.

18. The semiconductor device of claim 15,
wherein the operation circuit performs a post-program operation on the drain select transistor included in the first memory string after performing the erase operation on the drain select transistor included in the first memory string.

19. The semiconductor device of claim 18,
wherein the operation circuit performs a post-program verify operation after performing the post-program operation on the drain select transistor included in the first memory string.

20. The semiconductor device of claim 18,
wherein the operation circuit performs a post-program operation on drain select transistors included in the remaining memory strings after performing the post-program operation on the drain select transistor included in the first memory string.

* * * * *